(12) United States Patent
Wang et al.

(10) Patent No.: US 10,784,143 B2
(45) Date of Patent: Sep. 22, 2020

(54) TRENCH ISOLATION PRESERVATION DURING TRANSISTOR FABRICATION

(71) Applicant: GLOBALFOUNDRIES Inc., Grand Cayman (KY)

(72) Inventors: Haiting Wang, Clifton Park, NY (US); Guowei Xu, Ballston Lake, NY (US); Hui Zang, Guilderland, NY (US); Yue Zhong, Ballston Lake, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 16/263,650

(22) Filed: Jan. 31, 2019

(65) Prior Publication Data
US 2020/0251377 A1    Aug. 6, 2020

(51) Int. Cl.
| | |
|---|---|
| *H01L 29/76* | (2006.01) |
| *H01L 21/762* | (2006.01) |
| *H01L 21/8238* | (2006.01) |
| *H01L 21/3213* | (2006.01) |
| *H01L 29/78* | (2006.01) |
| *H01L 27/092* | (2006.01) |
| *H01L 29/66* | (2006.01) |

(52) U.S. Cl.
CPC .. *H01L 21/76224* (2013.01); *H01L 21/32137* (2013.01); *H01L 21/32139* (2013.01); *H01L 21/823821* (2013.01); *H01L 27/0924* (2013.01); *H01L 29/66795* (2013.01); *H01L 29/785* (2013.01)

(58) Field of Classification Search
CPC ......... H01L 21/76224; H01L 29/66795; H01L 21/823821; H01L 27/0924; H01L 21/32137; H01L 21/32139; H01L 29/785
USPC .......................................................... 257/288
See application file for complete search history.

(56) References Cited

U.S. PATENT DOCUMENTS

| | | | |
|---|---|---|---|
| 6,717,269 | B2 | 4/2004 | Shroff et al. |
| 8,946,038 | B2 * | 2/2015 | Hu ...................... H01L 27/0629 257/353 |
| 10,134,760 | B2 * | 11/2018 | Cheng ............... H01L 29/66545 |
| 2003/0143832 | A1 | 7/2003 | Shroff et al. |
| 2011/0269293 | A1 | 11/2011 | Kronholz et al. |
| 2013/0113068 | A1 | 5/2013 | Ramachandran et al. |

* cited by examiner

*Primary Examiner* — Vu A Vu
(74) *Attorney, Agent, or Firm* — Thompson Hine LLP; Francois Pagette

(57) ABSTRACT

Structures that include a field effect-transistor and methods of forming a structure that includes a field-effect transistor. A semiconductor fin has an upper portion and a lower portion, and a trench isolation region surrounds the lower portion of the semiconductor fin. The trench isolation region has a top surface arranged above the lower portion of the semiconductor fin and arranged below the upper portion of the semiconductor fin. A dielectric layer arranged over the top surface of the trench isolation region. The dielectric layer is composed of a low-k dielectric material.

17 Claims, 23 Drawing Sheets

TRENCH ISOLATION PRESERVATION DURING TRANSISTOR FABRICATION

BACKGROUND

The present invention relates to semiconductor device fabrication and integrated circuits and, more specifically, to structures that include a field effect-transistor and methods of forming a structure that includes a field-effect transistor.

Complementary-metal-oxide-semiconductor (CMOS) processes may be used to build a combination of p-type and n-type field-effect transistors that are used to construct, for example, logic cells. Field-effect transistors generally include a body providing a channel region, a source, a drain, and a gate electrode. When a control voltage exceeding a characteristic threshold voltage is applied to the gate electrode, carrier flow occurs in the channel region between the source and drain to produce a device output current.

A fin-type field-effect transistor (FinFET) is a non-planar device structure that may be more densely packed in an integrated circuit than planar field-effect transistors. A fin-type field-effect transistor may include a fin consisting of a body of semiconductor material, a gate structure that wraps about the fin, and heavily-doped source/drain regions spaced along the fin and arranged on opposite sides of the gate structure.

Gate structures may be formed as linear features that extend longitudinally across the fins of fin-type field-effect transistors that are associated with different active device regions. Lower portions of the fins are embedded in shallow trench isolation and upper portions of the fins are overlapped by the gate structures. As fin pitch and gate pitch scales downward, the dimensions of the open spaces between the fins and gates narrow. Various etching and cleaning processes may have an adverse effect on the shallow trench isolation exposed by open spaces between the fins that are crossed by the gate structures. Specifically, the shallow trench isolation may be eroded and recessed by the etching and cleaning processes. The resulting dishing of the shallow trench isolation may reduce the ability to adequately fill these open spaces with dielectric material from the subsequently-deposited interlayer dielectric layer and may even cause the gate structures to collapse. The resulting dishing of the shallow trench isolation may also extend the depth of the trench silicide contacts that are made with the source/drain regions, which unwantedly increases the effective capacitance.

Improved structures that include a field effect-transistor and methods of forming a structure that includes a field-effect transistor are needed.

SUMMARY

In an embodiment of the invention, a structure includes a semiconductor fin having an upper portion and a lower portion, and a trench isolation region surrounding the lower portion of the semiconductor fin. The trench isolation region has a top surface arranged above the lower portion of the semiconductor fin and arranged below the upper portion of the semiconductor fin. A dielectric layer arranged over the top surface of the trench isolation region. The dielectric layer is composed of a low-k dielectric material.

In an embodiment of the invention, a method includes forming a semiconductor fin having an upper portion and a lower portion, and forming a trench isolation region surrounding the lower portion of the semiconductor fin. The trench isolation region has a top surface arranged above the lower portion of the semiconductor fin and arranged below the upper portion of the semiconductor fin. The method further includes conformally depositing a dielectric layer over the upper portion of the semiconductor fin and the top surface of the trench isolation region, forming an etch mask that covers the dielectric layer over the trench isolation region and that exposes the dielectric layer in part over the upper portion of the semiconductor fin, and removing the dielectric layer that is exposed by the etch mask from the upper portion of the semiconductor fin.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention. In the drawings, like reference numerals are used to indicate like features in the various views.

DETAILED DESCRIPTION

Figure 1:
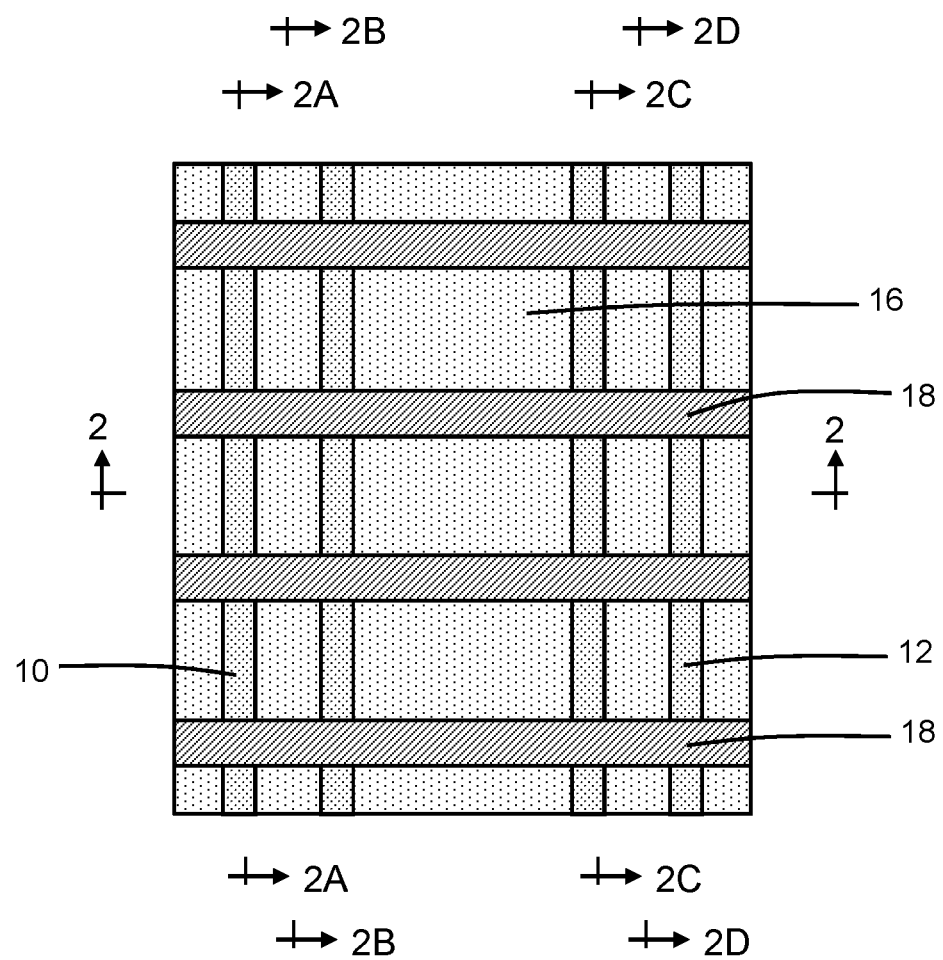
FIG. 1 is a top view of a structure at an initial fabrication stage of a processing method in accordance with embodiments of the invention.
Figure 2:
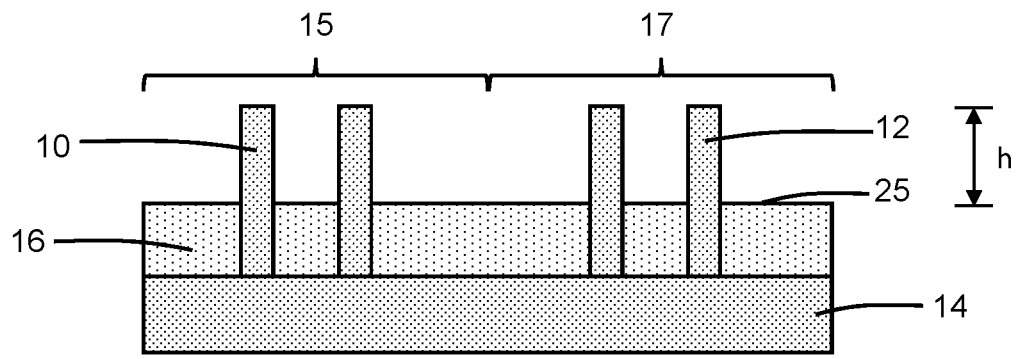
FIG. 2 is a cross-sectional view taken generally along line 2-2 in FIG. 1.
Figure 2A:
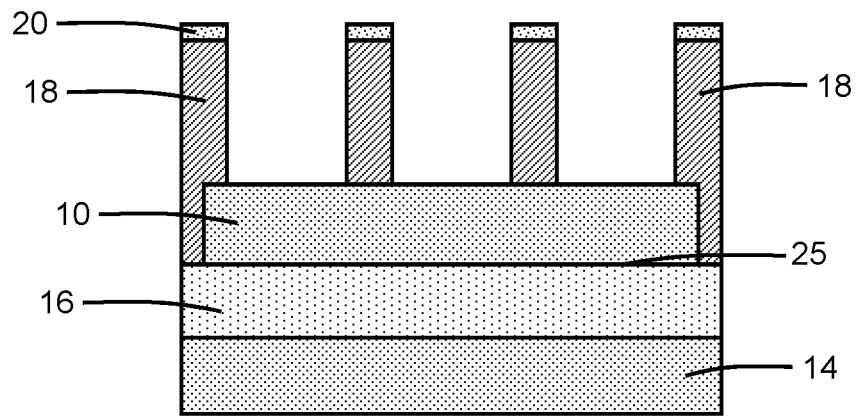
FIG. 2A is a cross-sectional view taken generally along line 2A-2A in FIG. 1.
Figure 2B:
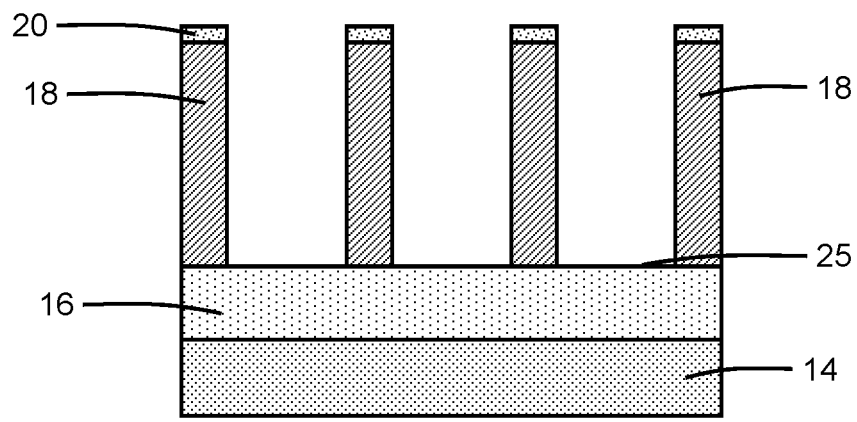
FIG. 2B is a cross-sectional view taken generally along line 2B-2B in FIG. 1.
Figure 2C:
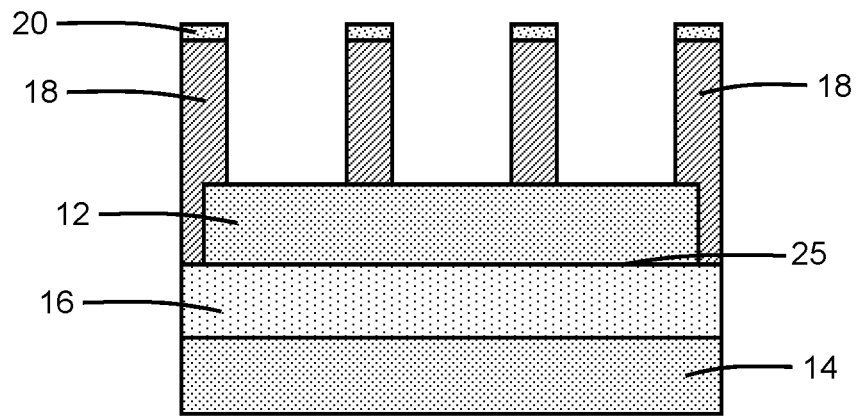
FIG. 2C is a cross-sectional view taken generally along line 2C-2C in FIG. 1.
Figure 2D:
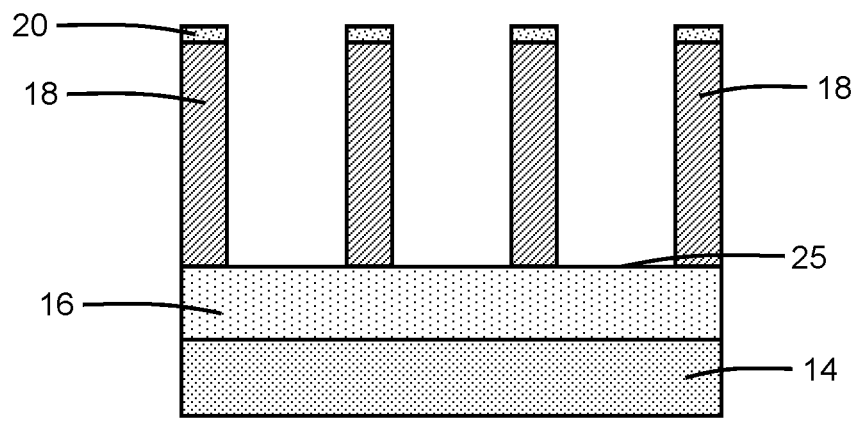
FIG. 2D is a cross-sectional view taken generally along line 2D-2D in FIG. 1.
Figure 3:
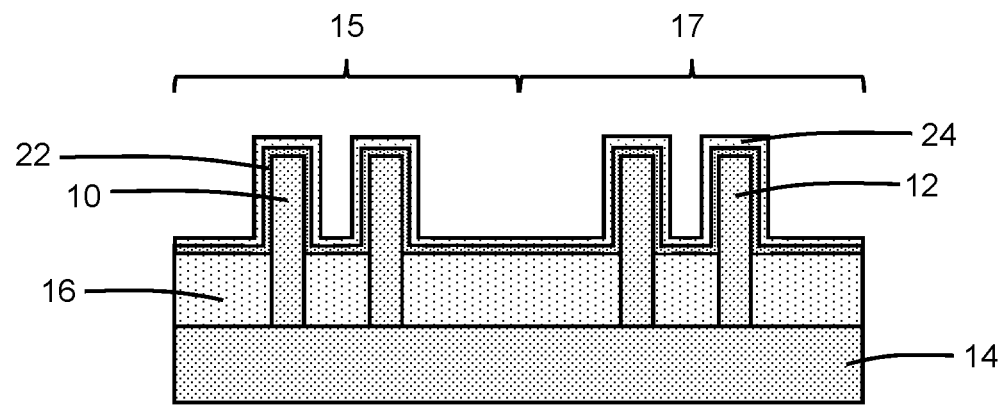
FIGS. 3, 3A-3D are cross-sectional views of the structure at a fabrication stage of the processing method subsequent to FIGS. 2, 2A-2D.
Figure 3A:
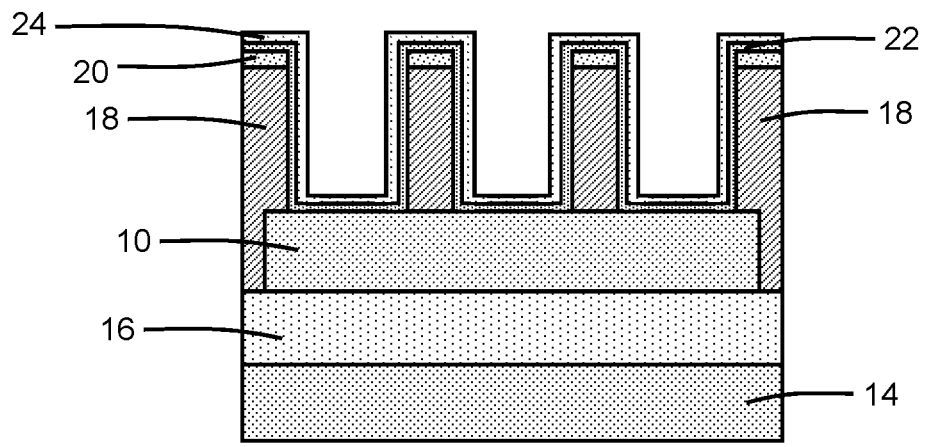
Figure 3B:
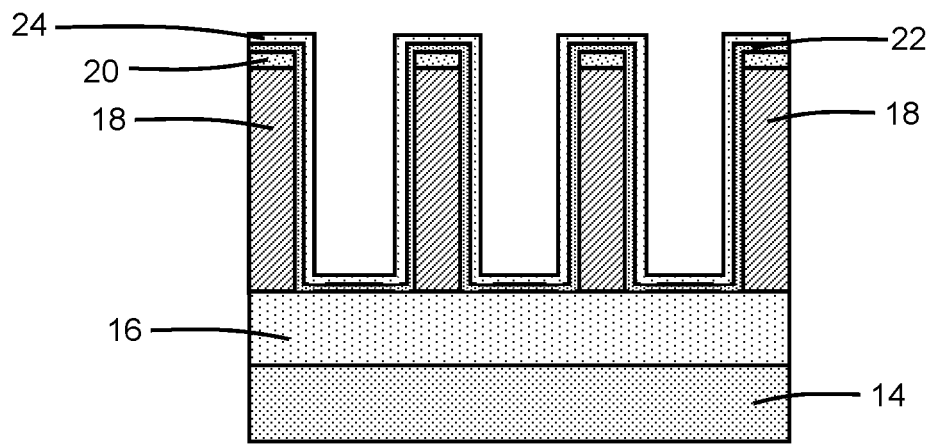
Figure 3C:
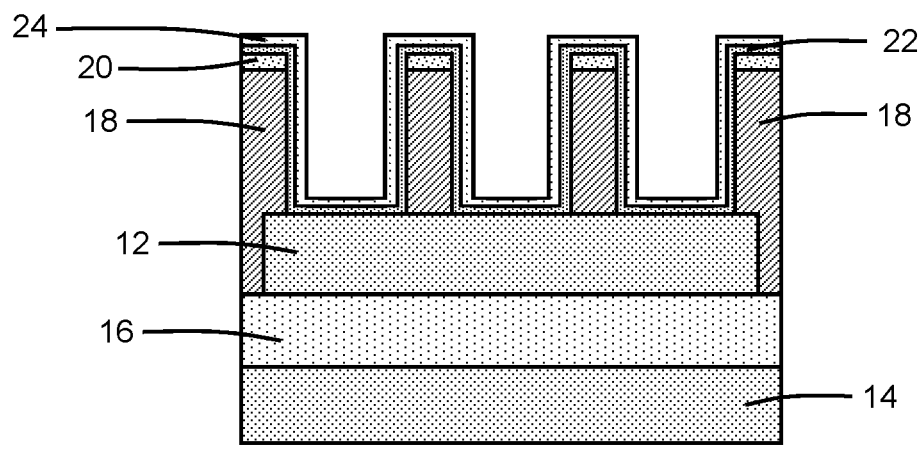
Figure 3D:
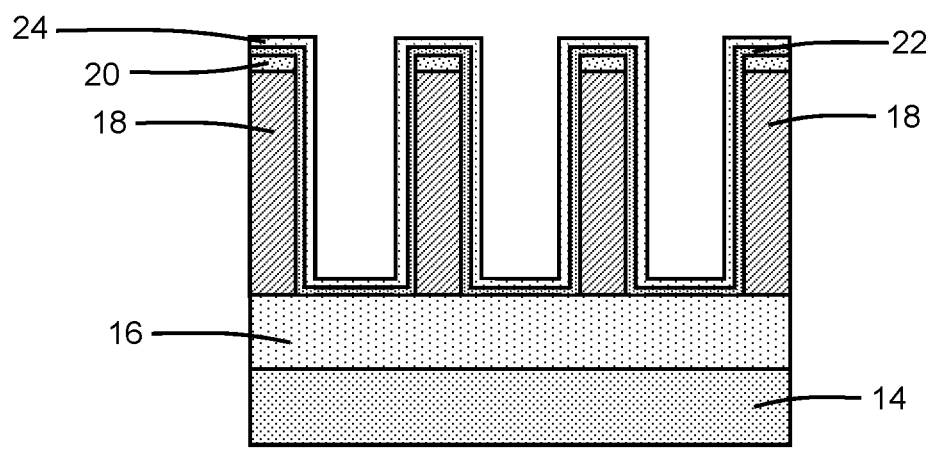
Figure 4:
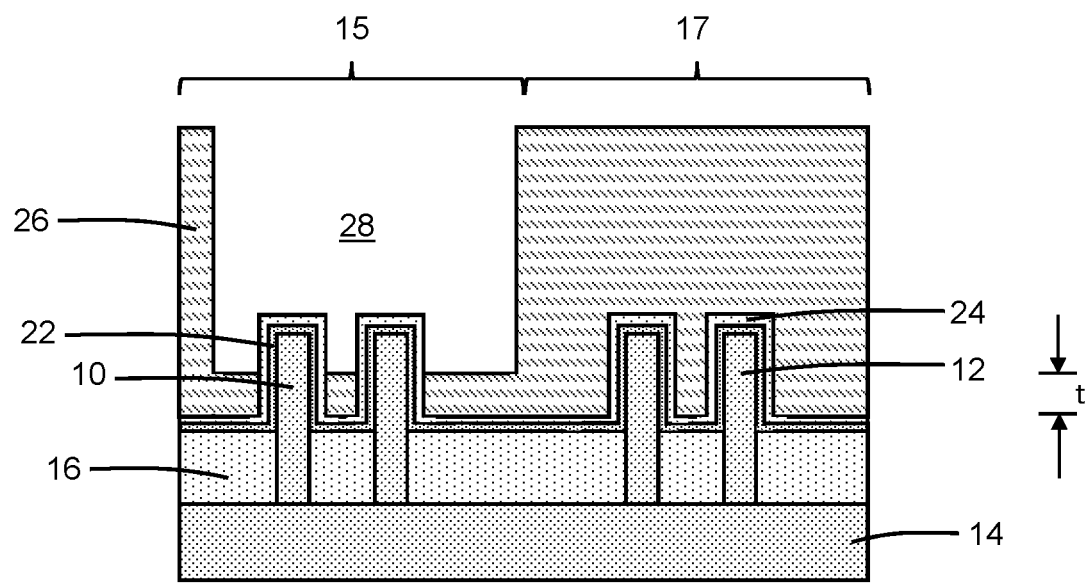
FIGS. 4, 4A-4D are cross-sectional views of the structure at a fabrication stage of the processing method subsequent to FIGS. 3, 3A-3D.
Figure 4A:
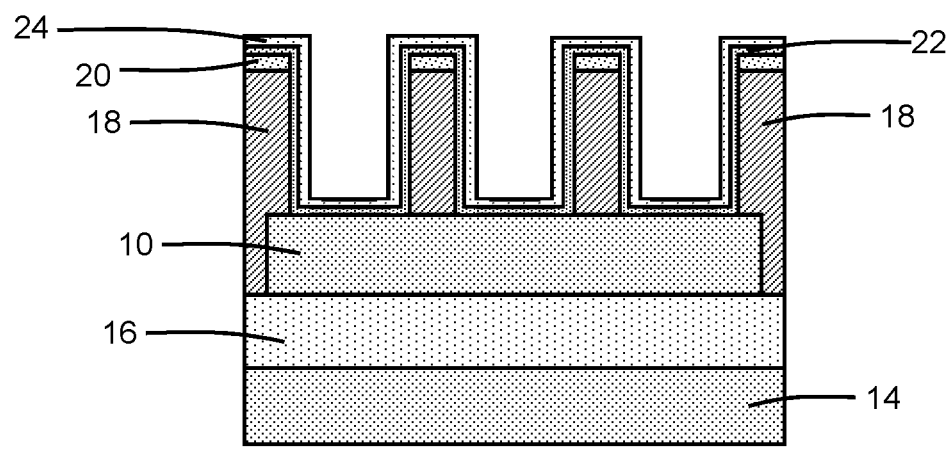
Figure 4B:
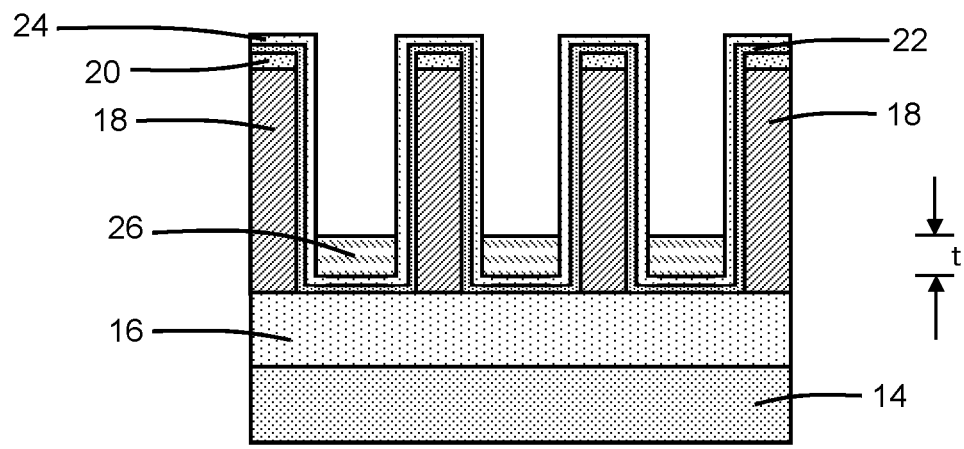
Figure 4C:
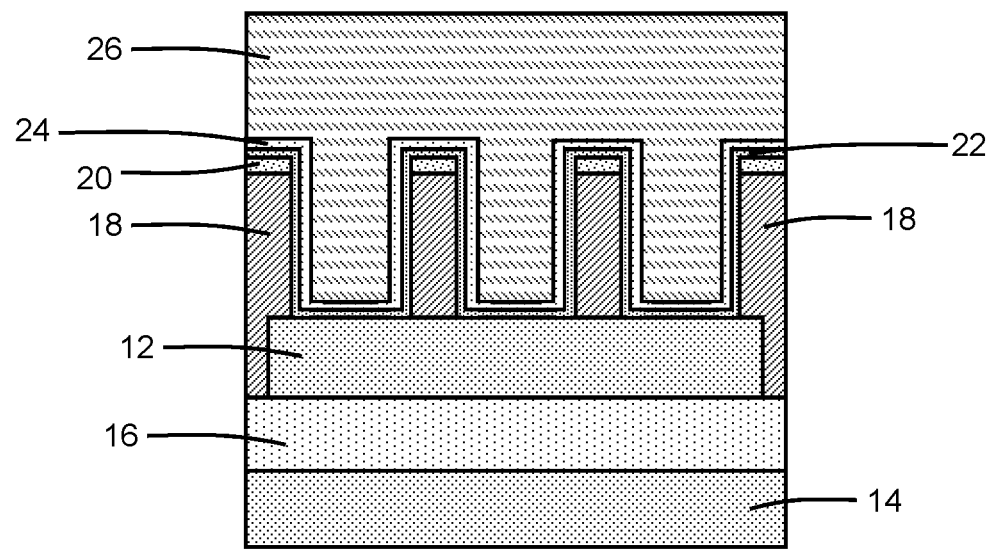
Figure 4D:
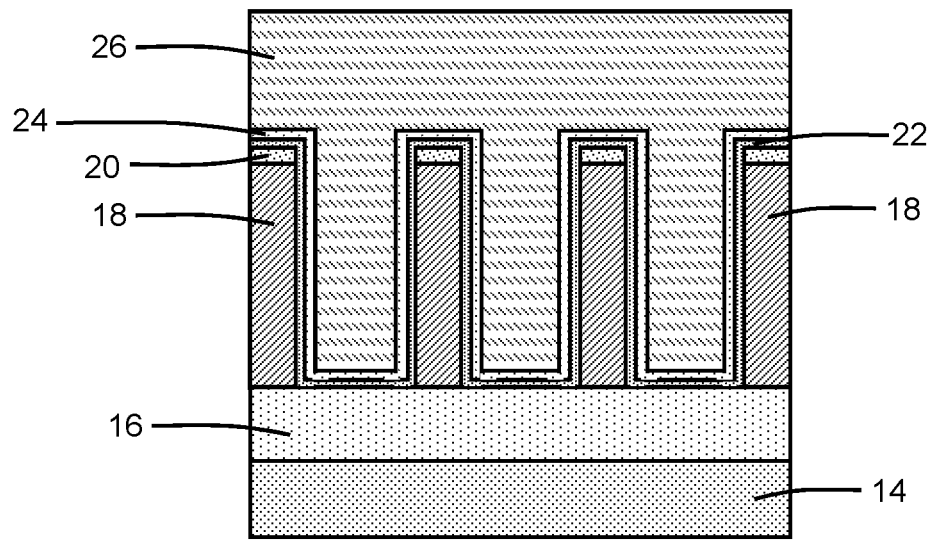
Figure 5:
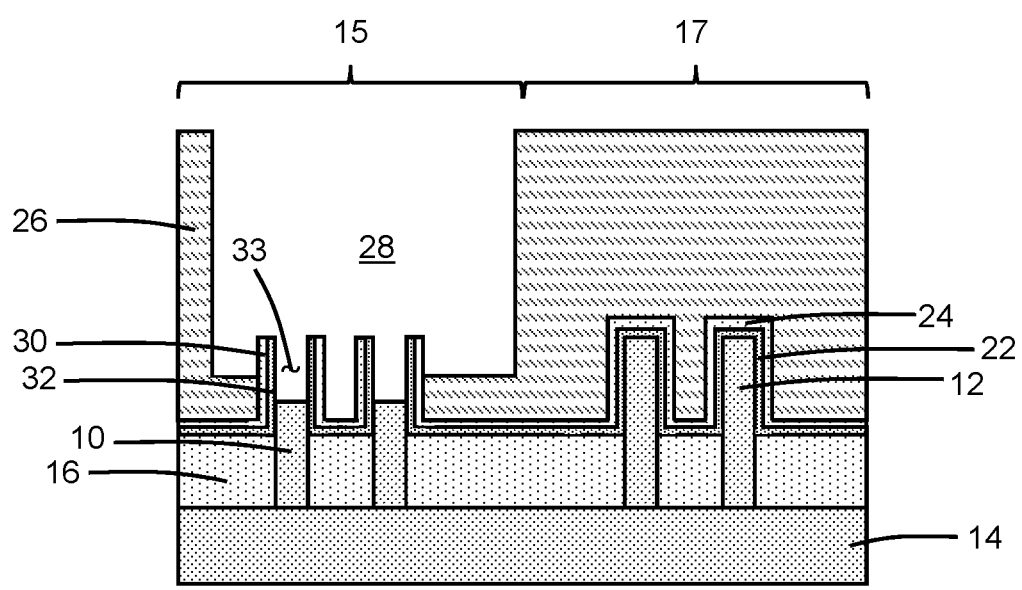
FIGS. 5, 5A-5D are cross-sectional views of the structure at a fabrication stage of the processing method subsequent to FIGS. 4, 4A-4D.
Figure 5A:
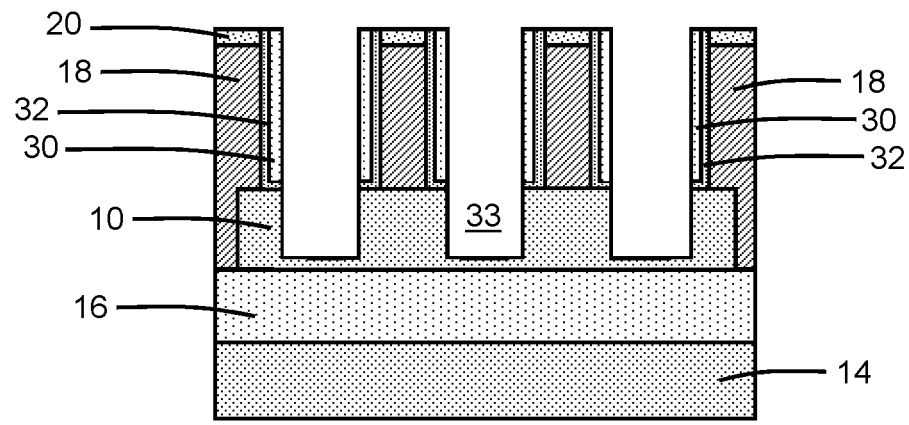
Figure 5B:
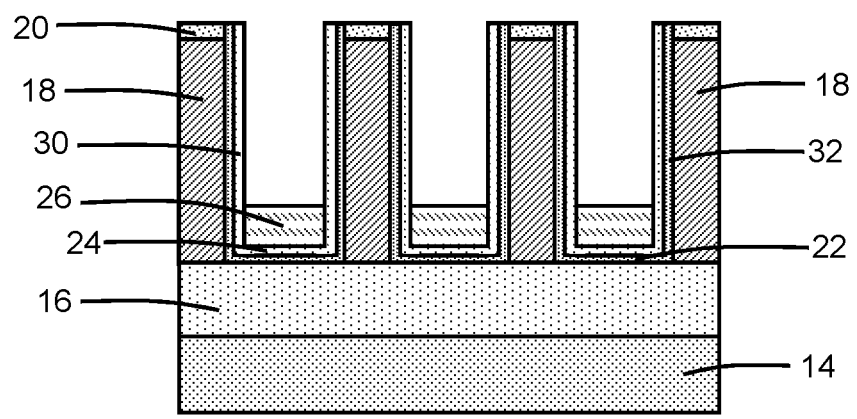
Figure 5C:
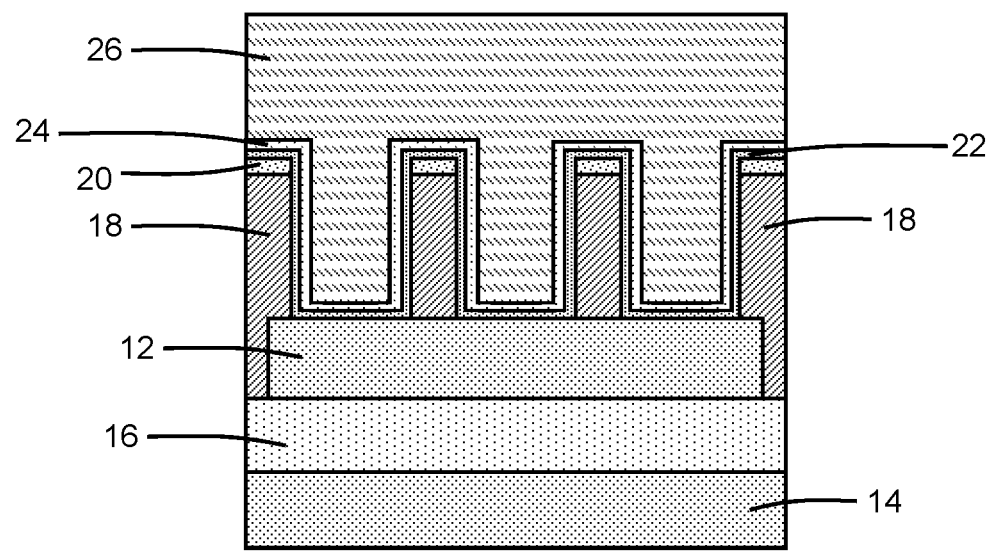
Figure 5D:
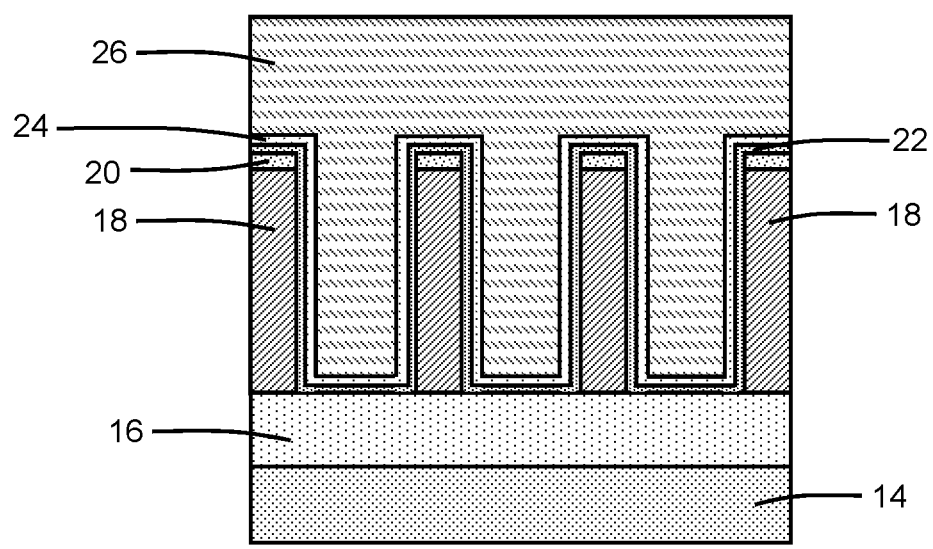
Figure 6:
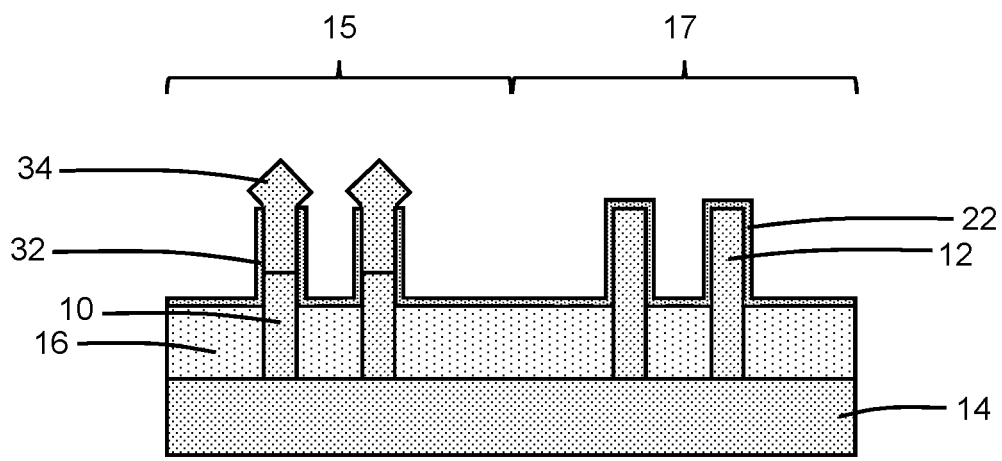
FIGS. 6, 6A-6D are cross-sectional views of the structure at a fabrication stage of the processing method subsequent to FIGS. 5, 5A-5D.
Figure 6A:
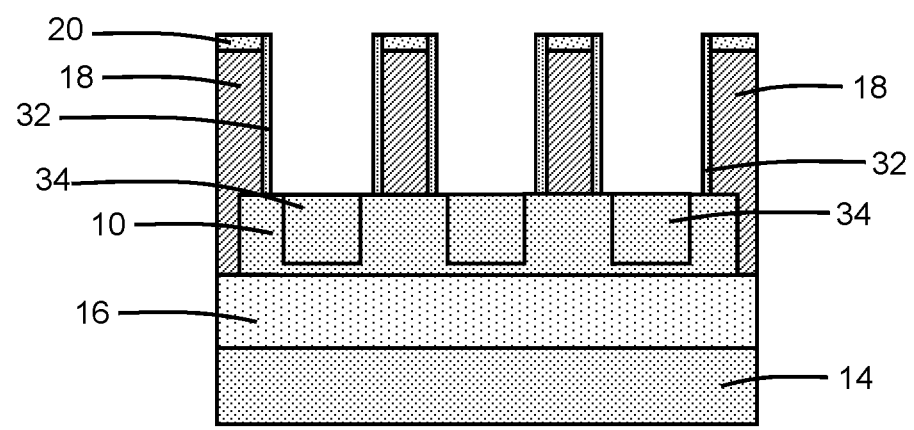
Figure 6B:
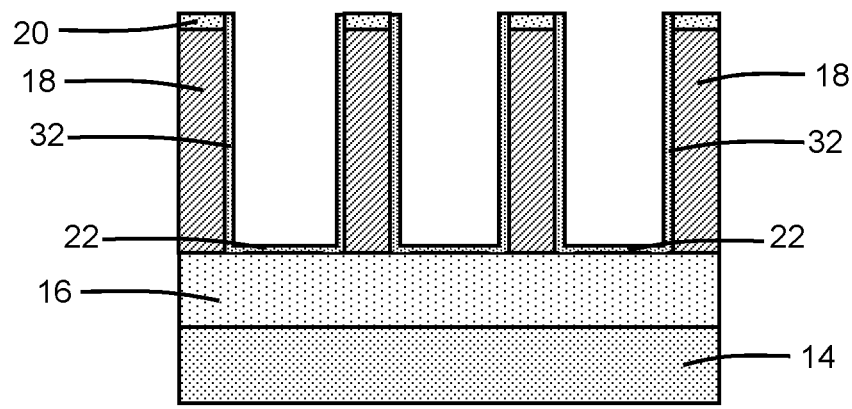
Figure 6C:
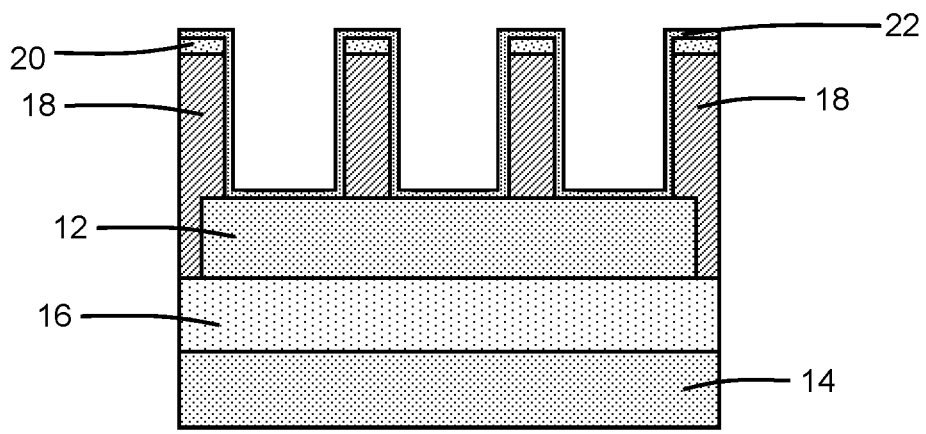
Figure 6D:
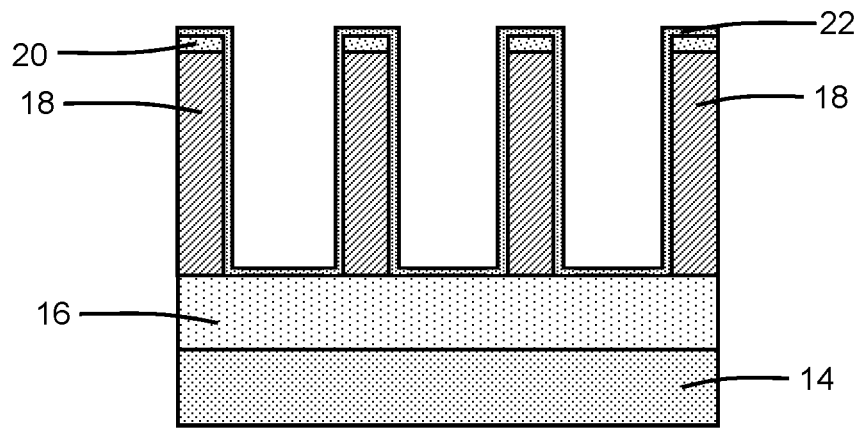
Figure 7:
FIGS. 7, 7A-7D are cross-sectional views of the structure at a fabrication stage of the processing method subsequent to FIGS. 6, 6A-6D.
Figure 7:
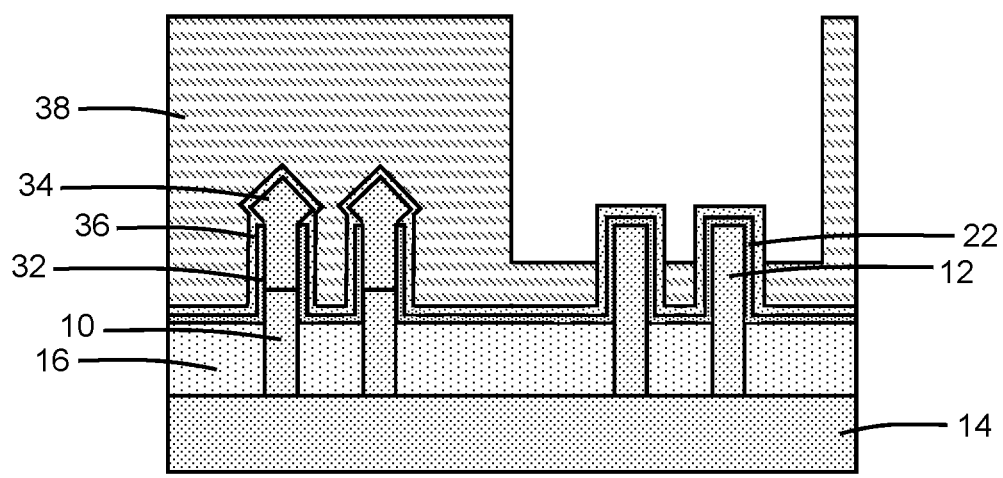
Figure 7A:
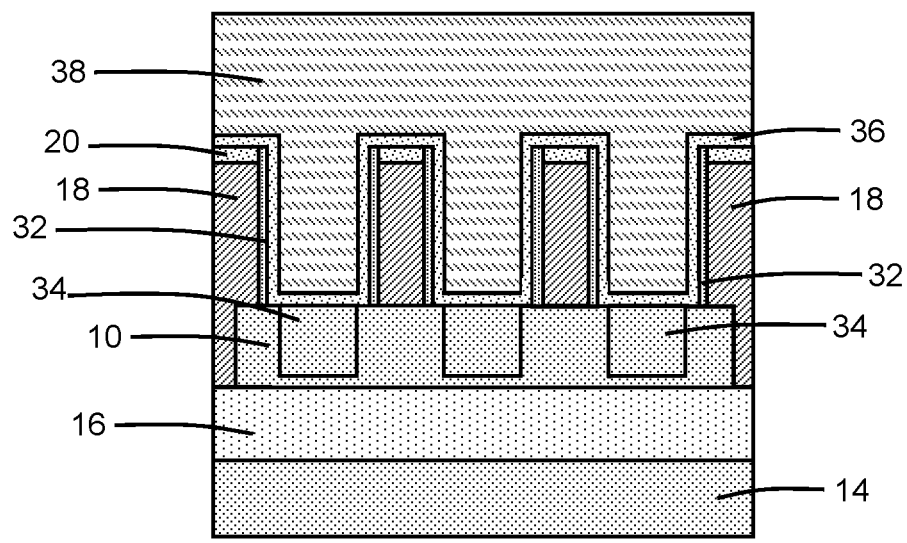
Figure 7B:
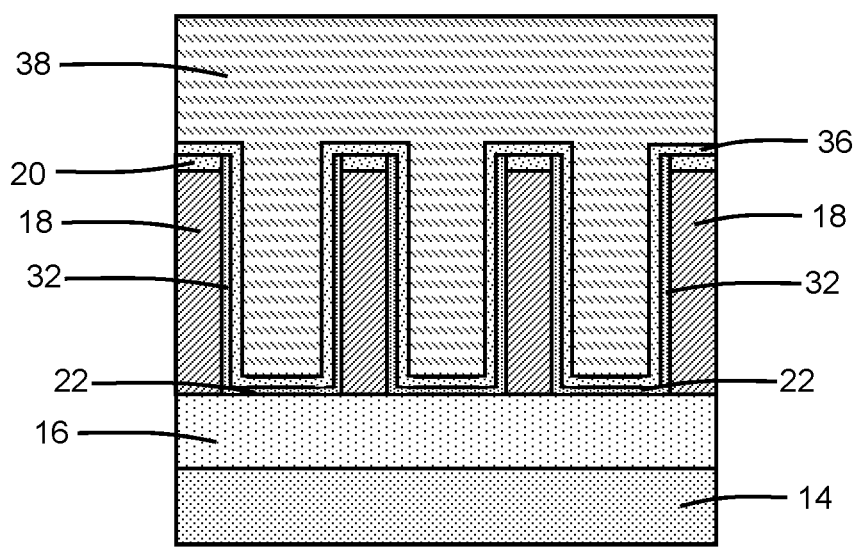
Figure 7C:
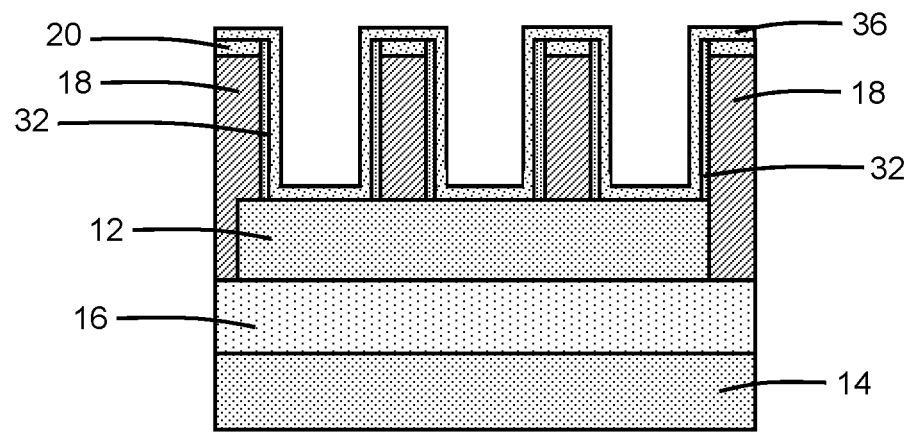
Figure 7D:
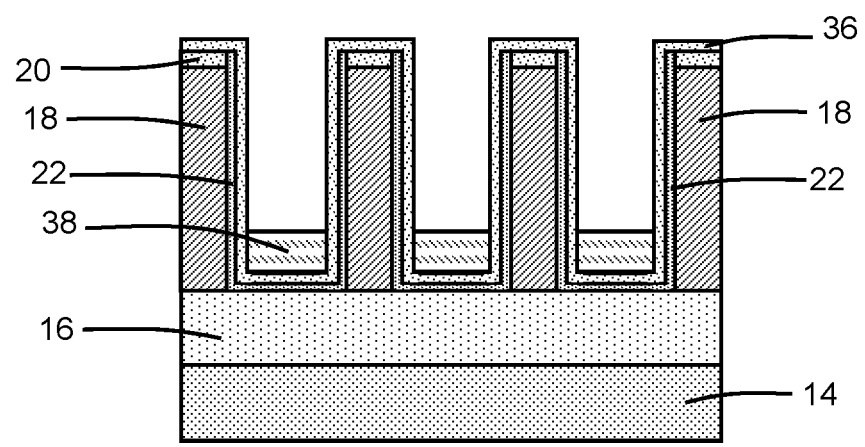
Figure 8:
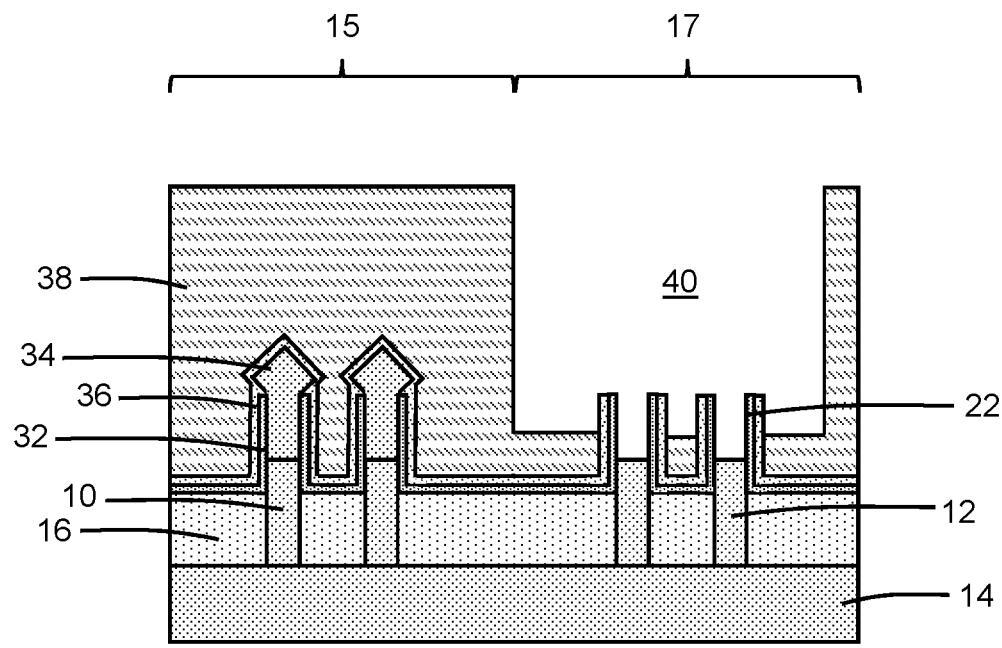
FIGS. 8, 8A-8D are cross-sectional views of the structure at a fabrication stage of the processing method subsequent to FIGS. 7, 7A-7D.
Figure 8A:
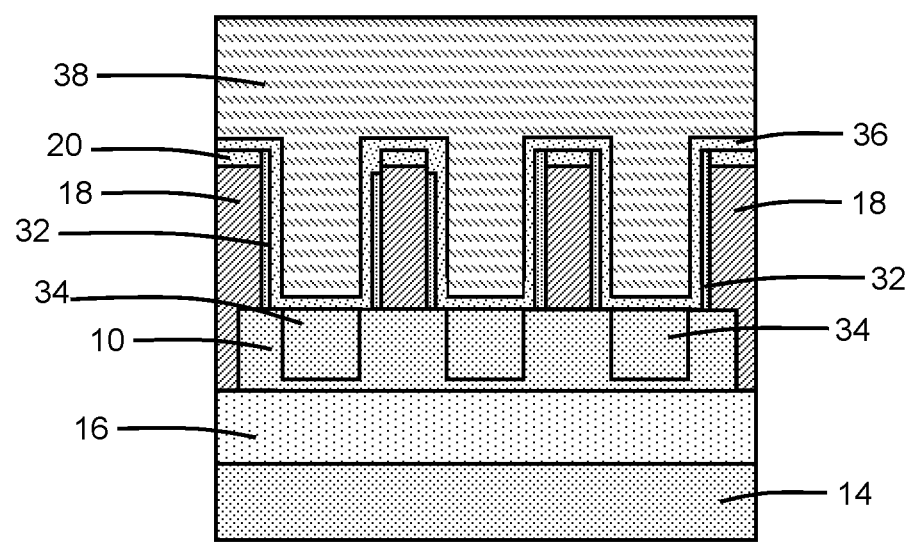
Figure 8B:
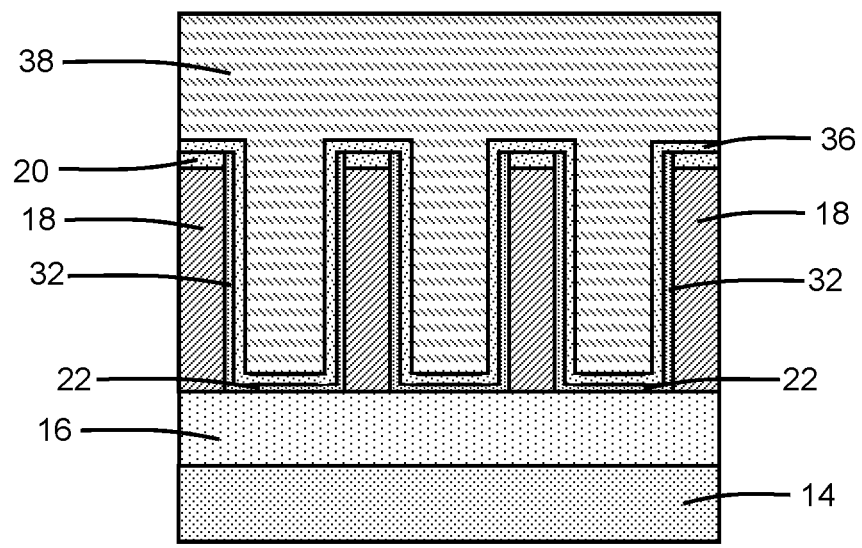
Figure 8C:
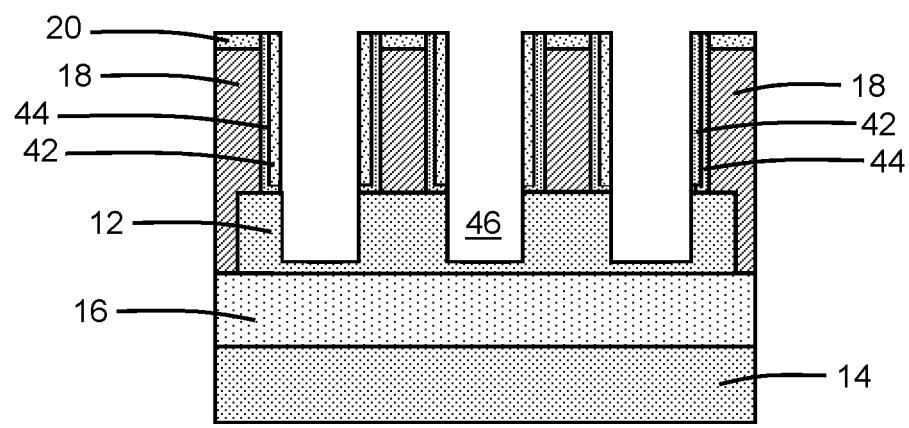
Figure 8D:
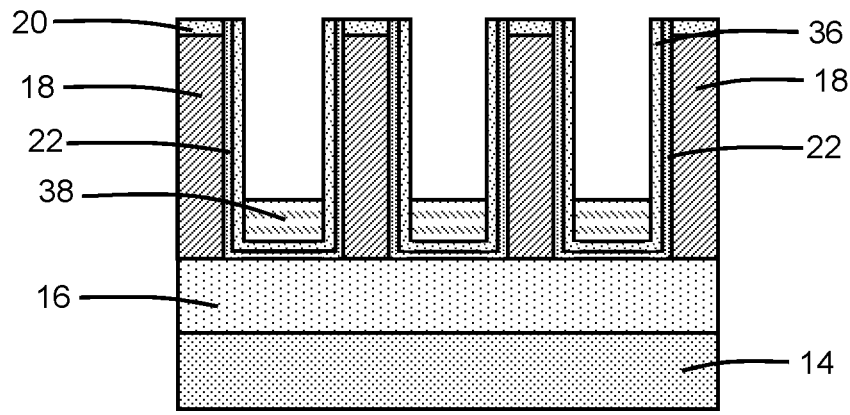
Figure 9:
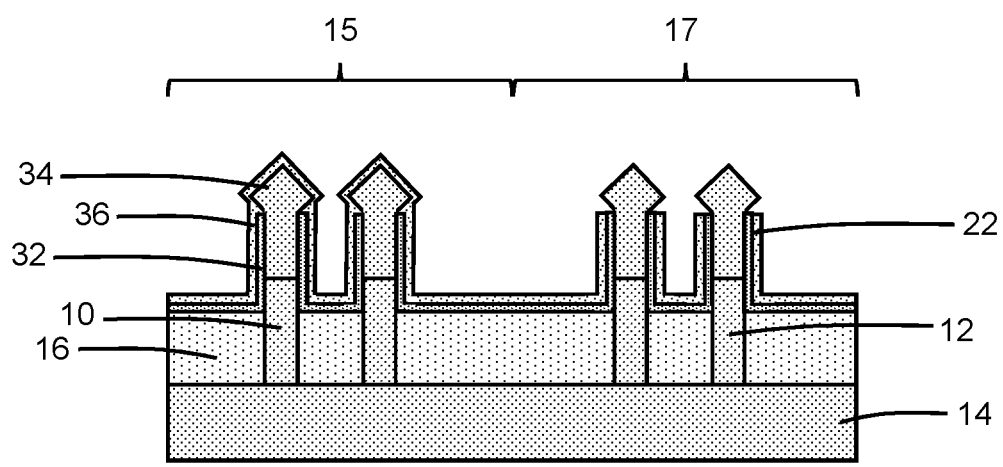
FIGS. 9, 9A-9D are cross-sectional views of the structure at a fabrication stage of the processing method subsequent to FIGS. 8, 8A-8D.
Figure 9A:
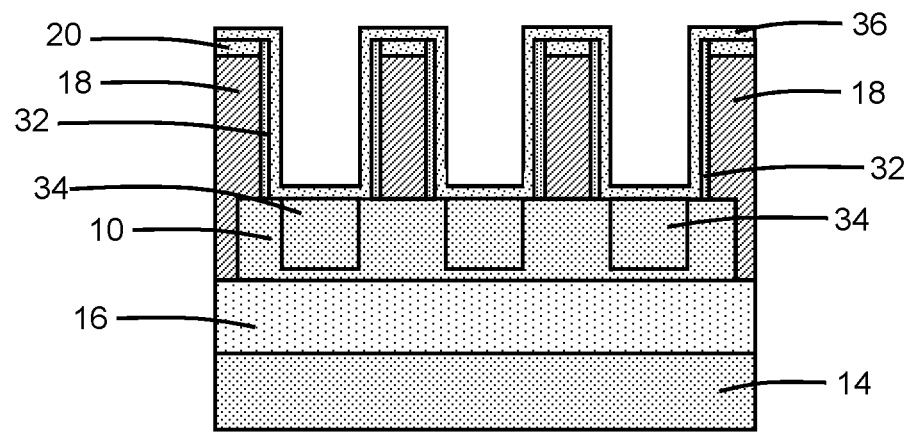
Figure 9B:
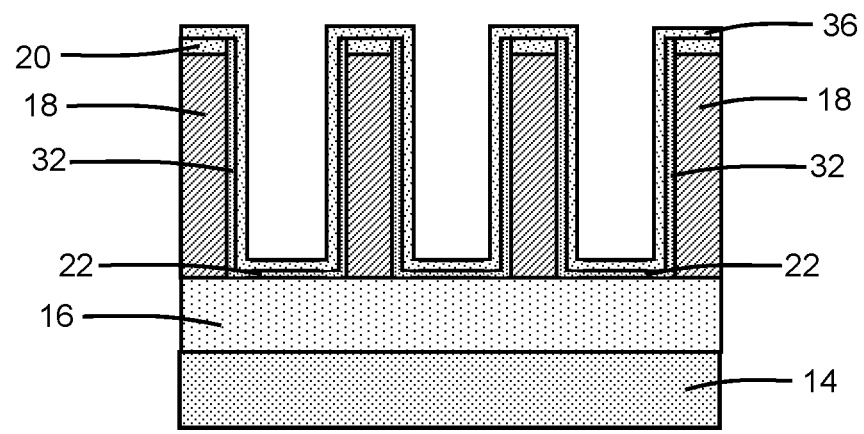
Figure 9C:
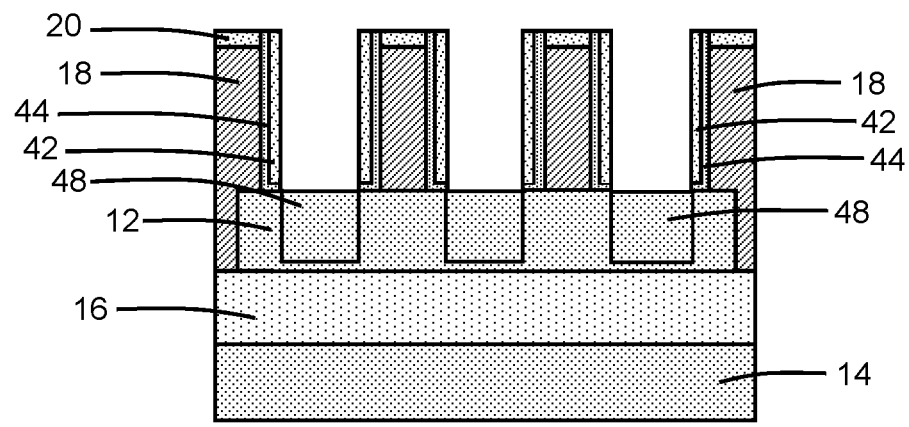
Figure 9D:
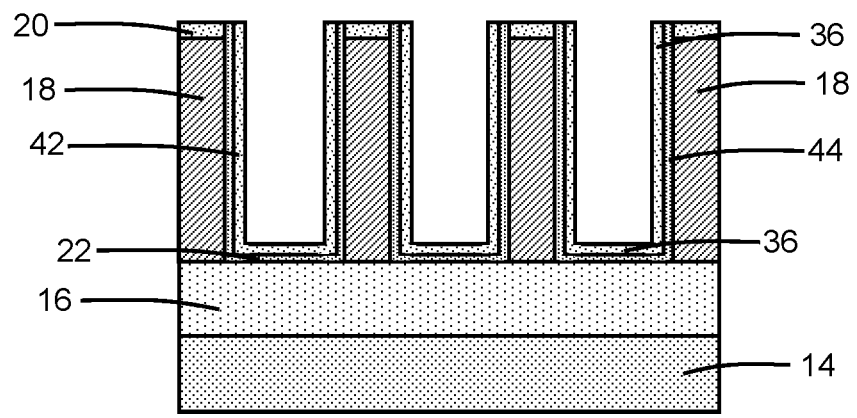

With reference to FIGS. 1, 2, 2A-2D and in accordance with embodiments of the invention, a structure includes semiconductor fins 10, 12 that project upwardly away from a substrate 14. The semiconductor fins 10, 12 may be formed by patterning the single-crystal semiconductor material (e.g., single-crystal silicon) of the substrate 14 with lithography and etching processes, and cutting the patterning semiconductor material into given lengths with a layout associated with the specific device structures being formed and their arrangement. A shallow trench isolation region 16 is formed that operates to electrically isolate the semiconductor fins 10, 12 from each other. The shallow trench isolation region 16 may be formed by depositing a layer composed of a dielectric material, such as an oxide of silicon (e.g., silicon dioxide), by chemical vapor deposition, and recessing with an etching process.

An upper portion of each of the semiconductor fins 10, 12 is revealed by the recessing of the shallow trench isolation region 16, and a lower portion of each of the semiconductor fins 10, 12 is surrounded by the shallow trench isolation region 16. The upper portions of the semiconductor fins 10, 12, which project or extend above a top surface 25 of the shallow trench isolation region 16, have a height, h, relative to the top surface 25. The semiconductor fins 10 may be arranged in a device region 15 and used to form one variety of field-effect transistor (e.g., a p-type field-effect transistor (pFET)), and the semiconductor fins 12 may be arranged in a device region 17 and used to form a different variety of field-effect transistor (e.g., an n-type field-effect transistor (nFET)).

The structure further includes gate structures 18 that extend along respective longitudinal axes over and across the semiconductor fins 10, 12 and shallow trench isolation region 16. Each gate structure 18 is arranged transverse to the semiconductor fins 10 and overlaps with and wraps about a section of each semiconductor fin 10. Each gate structure 18 is also arranged transverse to the semiconductor fins 12 and overlaps with and wraps about a section of each semiconductor fin 12. The gate structures 18 are also arranged on the top surface 25 of respective portions of the shallow trench isolation region 16 between the semiconductor fins 10, 12.

The gate structures 18 may be dummy or sacrificial gate structures that represent placeholder structures for other subsequently-formed gate structures, such as a replacement metal gate structures. The gate structures 18 have a spaced-apart arrangement along the respective longitudinal axes of the semiconductor fin 10, 12, and may be formed by depositing a dielectric layer containing, for example, silicon dioxide, depositing a non-dielectric layer containing, for example, amorphous silicon over the thin dielectric layer, and then patterning these layers with lithography and etching processes. A hardmask cap 20 composed of a dielectric material, such as silicon nitride, is arranged over each gate structure 18.

With reference to FIGS. 3, 3A-3D in which like reference numerals refer to like features in FIGS. 2, 2A-2D and at a subsequent fabrication stage of the processing method, a dielectric layer 22 and a dielectric layer 24 are serially deposited in a conformal manner over the semiconductor fins 10, the semiconductor fins 12, the shallow trench isolation region 16, and the gate structures 18. Each of the dielectric layers 22, 24 defines a liner that may have a conformal thickness. In an embodiment, the dielectric layer 22 may be composed of a dielectric material, such as a low-k dielectric material such as SiOCN, SiBCN, SiCO, SiOC, or SiC, conformally deposited by plasma-enhanced chemical vapor deposition or atomic layer deposition. In an embodiment, the dielectric layer 24 may be composed of a dielectric material, such as silicon dioxide conformally deposited by atomic layer deposition. In an embodiment, the dielectric layer 22 may have a directly contacting relationship with the top surface 25 of the shallow trench isolation region 16.

With reference to FIGS. 4, 4A-4D in which like reference numerals refer to like features in FIGS. 3, 3A-3D and at a subsequent fabrication stage of the processing method, an etch mask 26 is formed that fully covers the device region 17 and that includes an opening 28 over the device region 15. The etch mask 26 may include material from an organic planarization layer (OPL) that is applied as a spin-on hardmask and then patterned by lithography and etching processes to provide the opening 28. The etching process thinning and patterning the etch mask 26 is controlled such that the opening 28 only extends partially through the etch mask 26 over the portions of the shallow trench isolation region 16 surrounding the semiconductor fins 10 and between the gate structures 18 in device region 15. The top surfaces of the semiconductor fins 10 are exposed in spaces between the gate structures 18 by the thickness reduction of the etch mask 26.

A residual thickness, t, of the etch mask 26 is retained and remains over portions of the shallow trench isolation region 16 between the gate structures 18 and surrounding the semiconductor fins 10 in device region 15. The residual thickness of the etch mask 26 covers the dielectric layers 22, 24 over the top surface 25 of the portions of the shallow trench isolation region 16 in device region 15. The residual thickness of the etch mask 26 is equal to a fraction of the height (FIG. 2) of the upper portions of the semiconductor fins 10. In an embodiment, the residual thickness of the etch mask 26 may be approximately equal to one-half of the height of the upper portions of the semiconductor fins 10.

With reference to FIGS. 5, 5A-5D in which like reference numerals refer to like features in FIGS. 4, 4A-4D and at a subsequent fabrication stage of the processing method, sacrificial sidewall spacers 30 are formed from the dielectric layer 24 using an anisotropic etching process. The sacrificial sidewall spacers 30 are arranged adjacent to the semiconductor fins 10 and gate structures 18 in the device region 15. The anisotropic etching process removes the dielectric material of the dielectric layer 24 from the top surface of each semiconductor fin 10 between the gate structures 18. The residual thickness of the etch mask 26 covers and masks the portions of the dielectric layers 22, 24 over the shallow trench isolation region 16 in device region 15 during the anisotropic etching process. These portions of the dielectric layers 22, 24 are not eroded by the anisotropic etching process.

After the sacrificial sidewall spacers 30 are formed, sidewall spacers 32 are formed from the dielectric layer 22 using an anisotropic etching process. The sidewall spacers 32 are arranged adjacent to the semiconductor fins 10 and the gate structures 18 in device region 15. The anisotropic etching process removes the dielectric material of the dielectric layer 22 from the top surface of each semiconductor fin 10 between the gate structures 18. The residual thickness of the etch mask 26 covers the portions of the dielectric layers 22, 24 over the shallow trench isolation region 16 in device region 15 during the anisotropic etching process. These portions of the dielectric layers 22, 24 are not eroded by the anisotropic etching process.

The residual thickness of the etch mask 26 fully covers portions of the dielectric layers 22, 24 arranged over the shallow trench isolation region 16 between the gate structures 18 and surrounding the semiconductor fins 10 in device region 15 during the etching processes. These remaining portions of the dielectric layer 24 directly connect adjacent sacrificial sidewall spacers 30 and, similarly, these remaining portions of the dielectric layer 22 directly connect adjacent sidewall spacers 32.

After the sidewall spacers 30, 32 are formed, cavities 33 are formed in the semiconductor fins 10 in the spaces between the gate structures 18. The cavities 33 may be etched using one or more etching processes that are selected to provide a given cavity shape. The residual thickness of the etch mask 38 continues to cover the portions of the dielectric layers 22, 24 over the top surface 25 of the shallow trench isolation region 16 in device region 15 during the one or more etching processes.

The device region 17 are fully covered and protected by the etch mask 26 at all times during the different etching processes performed in connection with the device region 15.

With reference to FIGS. 6, 6A-6D in which like reference numerals refer to like features in FIGS. 5, 5A-5D and at a subsequent fabrication stage of the processing method, the etch mask 26 is removed by, for example, ashing with an oxygen plasma. After removing the etch mask 26, a cleaning process is used to remove oxide and carbon contaminants. The cleaning process also removes the portions of the dielectric layer 24 exposed by the removal of the etch mask 26 and the sacrificial sidewall spacers 30 that were formed from the dielectric layer 24. For example, the cleaning process may be a remote plasma-assisted dry etch process that involves the simultaneous exposure of the exposed portions of the dielectric layer 24 and the sacrificial sidewall spacers 30 to $NF_3$ and $NH_3$ plasma by-products, and that removes the silicon dioxide of the dielectric layer 24 and the sacrificial sidewall spacers 30 but does not readily etch the semiconductor material of the semiconductor fins 10, 12, the dielectric material of the hardmask caps 20 over the gate structures 18, and the dielectric layer 22 and sidewall spacers 32.

The top surface 25 of the shallow trench isolation region 16 is covered and protected during the cleaning process. The presence of the dielectric layer 22 over exposed portions of the shallow trench isolation region 16 in device region 15 and over exposed portions of the shallow trench isolation region 16 in device region 17 prevents erosion of the shallow trench isolation region 16 and recessing of the top surface 25 by the cleaning process.

The cavities 33 are filled with respective semiconductor layers 34 that are epitaxially grown from the semiconductor fins 10. The semiconductor layers 34 may be formed by an epitaxial growth process in which semiconductor material epitaxially grows from the exposed surfaces of semiconductor fin 10. The epitaxial semiconductor layers 34 associated with semiconductor fins 10 may contain silicon-germanium that is doped during epitaxial growth with a p-type dopant (e.g., boron, aluminum, gallium, and/or indium) to provide p-type electrical conductivity. The epitaxial semiconductor layers 34 furnish source/drain regions for p-type field-effect transistors formed using the semiconductor fins 10, and provide enlarged landing areas for source/drain regions contacts. As used herein, the term "source/drain region" means a doped region of semiconductor material that can function as either a source or a drain of a field-effect transistor. The dielectric layer 22 is unbroken in device region 17 and operates to prevent epitaxial growth from, for example, the semiconductor fins 12.

With reference to FIGS. 7, 7A-7D in which like reference numerals refer to like features in FIGS. 6, 6A-6D and at a subsequent fabrication stage of the processing method, a dielectric layer 36 is applied as a protect film in device regions 15, 17. The dielectric layer 36 may be composed of a dielectric material, such as silicon nitride, that is conformally deposited by atomic layer deposition. An etch mask 38 is then formed that covers and masks the device region 15 and that includes an opening 40 located over the device region 17. The etch mask 38 may include material from an organic planarization layer (OPL) that is applied as a spin-on hardmask and then patterned by lithography and etching processes to define the opening 40. In the device region 17, the etching process thinning and patterning the etch mask 38 is controlled such that the opening 40 only extends partially through the etch mask 38 over the shallow trench isolation region 16. The top surfaces of the semiconductor fins 12 are exposed in the spaces between the gate structures 18 by the thickness reduction of the etch mask 38.

A residual thickness, t, of the etch mask 38 is retained and remains over portions of the shallow trench isolation region 16 between the gate structures 18 and surrounding the semiconductor fins 10 in device region 17. The residual thickness of the etch mask 38 is equal to a fraction of the height (FIG. 2) of the upper portions of the semiconductor fins 12, and covers the top surface 25 of the shallow trench isolation region 16 between the gate structures 18 and about the semiconductor fins 12. In an embodiment, the residual thickness of the etch mask 38 remaining over the shallow trench isolation region 16 in device region 17 may be approximately equal to one-half of the height of the upper portions of the semiconductor fins 12.

With reference to FIGS. 8, 8A-8D in which like reference numerals refer to like features in FIGS. 7, 7A-7D and at a subsequent fabrication stage of the processing method, sacrificial sidewall spacers 42 are formed from the dielectric layer 36 using an anisotropic etching process. The sacrificial sidewall spacers 42 are arranged adjacent to the semiconductor fins 12 and the gate structures 18 in device region 17. The anisotropic etching process removes the dielectric material of the dielectric layer 36 from the top surface of each semiconductor fin 12 between the gate structures 18. The residual thickness of the etch mask 38 covers the portion of the dielectric layer 36 over the top surface 25 of the shallow trench isolation region 16 in device region 17 during the anisotropic etching process.

After the sacrificial sidewall spacers 42 are formed, sidewall spacers 44 are formed from the dielectric layer 22 using an anisotropic etching process. The sidewall spacers 44 are arranged adjacent to the semiconductor fins 10 and the gate structures 18 in device region 17. The anisotropic etching process removes the dielectric material of the dielectric layer 22 from the top surface of each semiconductor fin 12 between the gate structures 18. The residual thickness of the etch mask 38 covers the portion of the dielectric layers 22, 36 over the top surface 25 of the shallow trench isolation region 16 in device region 17 during the anisotropic etching process. These portions of the dielectric layers 22, 36 are not eroded by the anisotropic etching process.

After the sidewall spacers 44 are formed, cavities 46 are formed in the semiconductor fins 12 in the spaces between the gate structures 18. The cavities 46 may be etched by one or more etching processes to provide a given cavity shape. The residual thickness of the etch mask 38 covers the portions of the dielectric layers 22, 36 over the shallow trench isolation region 16 in device region 17 during the one or more etching processes. These portions of the dielectric layers 22, 36 are not eroded by the anisotropic etching process.

The device region 15 is fully covered and protected by the etch mask 38 during the etching processes preformed in connection with the device region 17.

With reference to FIGS. 9, 9A-9D in which like reference numerals refer to like features in FIGS. 8, 8A-8D and at a subsequent fabrication stage of the processing method, the etch mask 38 is removed by, for example, ashing with an oxygen plasma. After removing the etch mask 38, a cleaning process is used to remove any residual contamination from the removal of the etch mask 38 and/or any native oxide that may be present. The presence of the dielectric layers 22, 36 over the shallow trench isolation region 16 in device region 15 and over the shallow trench isolation region 16 in device region 17 prevents erosion of the shallow trench isolation region 16 by the cleaning process.

The cavities 46 are filled with semiconductor layers 48 that are epitaxially grown from the semiconductor fins 12. The semiconductor layers 48 may be formed by an epitaxial growth process in which semiconductor material epitaxially grows from the exposed surfaces of the upper portions of the semiconductor fin 12. The epitaxial semiconductor layers 48 associated with semiconductor fins 12 may contain silicon that is doped during epitaxial growth with an n-type dopant (e.g., phosphorus and/or arsenic) to provide n-type electrical conductivity. The epitaxial semiconductor layers 48 furnish source/drain regions for n-type field-effect transistors formed using the semiconductor fin 12, and provide enlarged landing areas for source/drain regions contacts. The dielectric layer 36 is unbroken in device region 15 and, in particular, operates to prevent epitaxial growth of semiconductor material from, for example, the semiconductor fins 12.

With reference to FIGS. 10, 10A-10D in which like reference numerals refer to like features in FIGS. 9, 9A-9D and at a subsequent fabrication stage of the processing method, the dielectric layer 36 is removed with an etching process, and a conformal contact etch stop layer (CESL) 49 and an interlayer dielectric layer 50 are formed in both of the device regions 15, 17. The interlayer dielectric layer 50 may be composed of a dielectric material, such as an oxide of silicon (e.g., silicon dioxide), that is deposited by chemical vapor deposition and planarized. The CESL 49 may be composed of a thin layer of a dielectric material, such as silicon nitride, deposited by atomic layer deposition. The CESL 49 provides a liner arranged between the epitaxial semiconductor layers 34, 48 and the sections of interlayer dielectric layer 50, and between the sidewall spacers 32, 44 and the sections of interlayer dielectric layer 50.

The gate structures 18 and their hardmask caps 20 are removed as part of a replacement metal gate process forming gate structures 52 and gate caps 54. Each gate structure 52 may include a gate electrode and a gate dielectric between the gate electrode and the respective semiconductor fins 10, 12, the gate electrode may include one or more conformal barrier metal layers and/or work function metal layers, such as metal layers composed of titanium aluminum carbide and/or titanium nitride, and/or a metal gate fill layer composed of a conductor, such as tungsten, cobalt, or aluminum, and the gate dielectric may be composed of a high-k dielectric material, such as hafnium oxide.

Trench silicide (TS) contacts 56, 58 are formed that are physically and electrically connected with the epitaxial semiconductor layers 34 and the epitaxial semiconductor layers 48. The TS contacts 56, 58 may contain a metal silicide, such as tungsten silicide, titanium silicide, nickel silicide, or cobalt silicide. The TS contacts 56, 58 may be deposited by, for example, chemical vapor deposition, pla-narized by chemical-mechanical polishing, and recessed with a selective etching process. The TS contacts 56, 58 may directly contact the top surface 25 of portions of the shallow trench isolation region 16 in the spaces between the semiconductor fins 10, 12 and the gate structures 52. In an embodiment, each of the TS contacts 56, 58 may including a first portion arranged over the trench isolation regions 16 and a second portion that is coupled with the respective epitaxial semiconductor layers 34, 48. The dielectric layer 22 is arranged between the top surface 25 of the trench isolation regions 25 and the first portion of each of the TS contacts 56, 58. In an embodiment, the first portion of each of the TS contacts 56, 58 may have a directly contacting relationship with the dielectric layer 22.

The top surface 25 of the shallow trench isolation region 16 is substantially planar at the fabrication stage of the process flow prior to the formation of the TS contacts 56, 58. Thus, the effective capacitance is not increased by material from the TS contacts 56 filling spaces eroded into the shallow trench isolation region 16, as may occur if the top surface 25 of the shallow trench isolation region 16 is not protected during the various etches and cleans.

Figure 10:
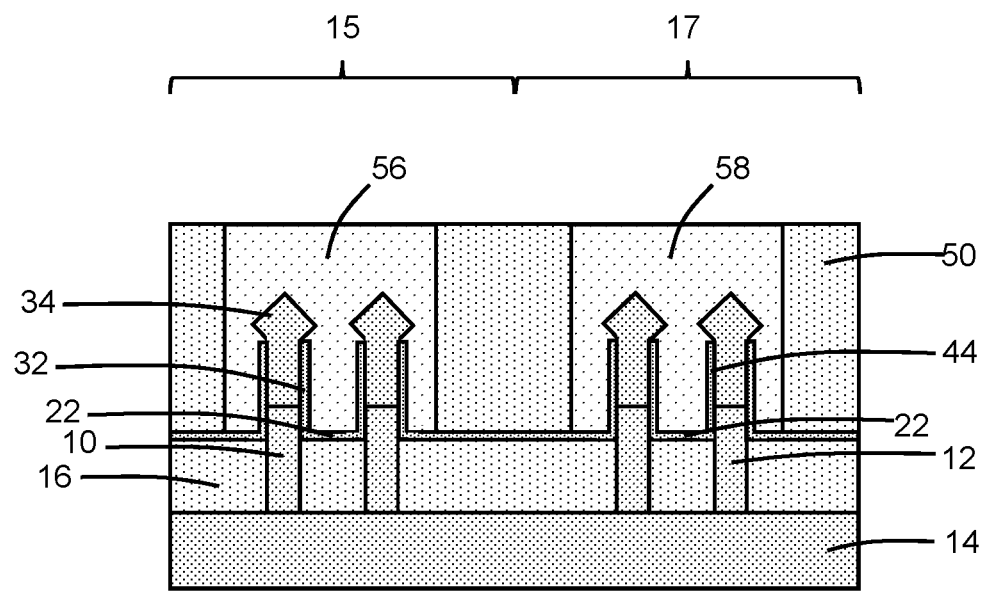
FIGS. 10, 10A-10D are cross-sectional views of the structure at a fabrication stage of the processing method subsequent to FIGS. 9, 9A-9D.
Figure 10A:
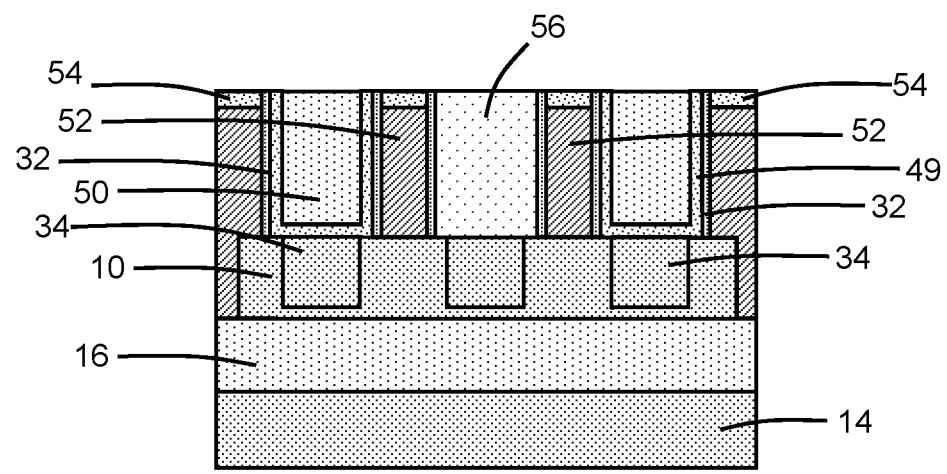
Figure 10B:
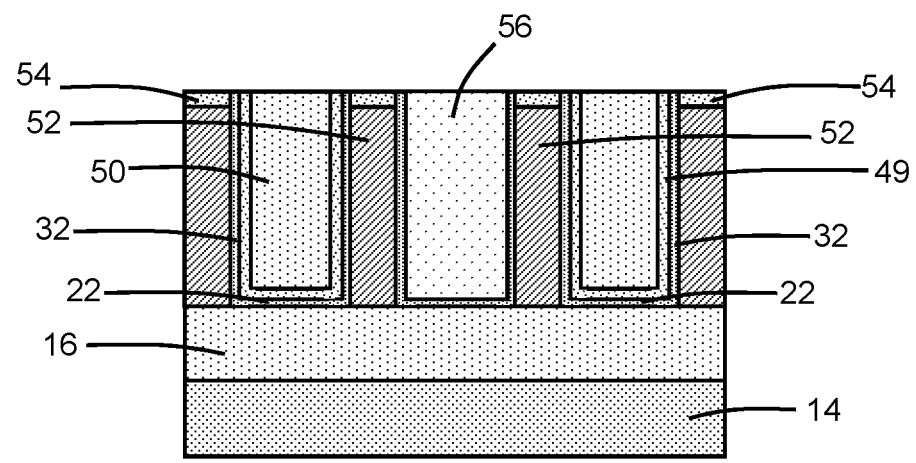
Figure 10C:
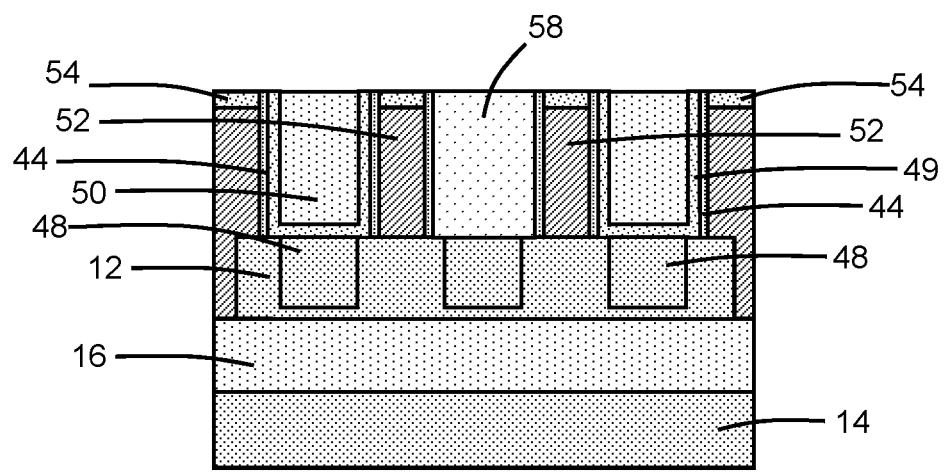
Figure 10D:
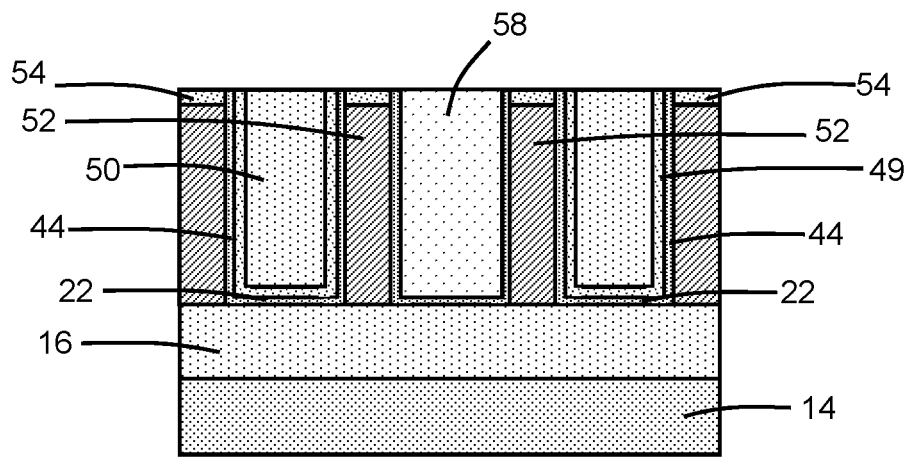
Figure 11:
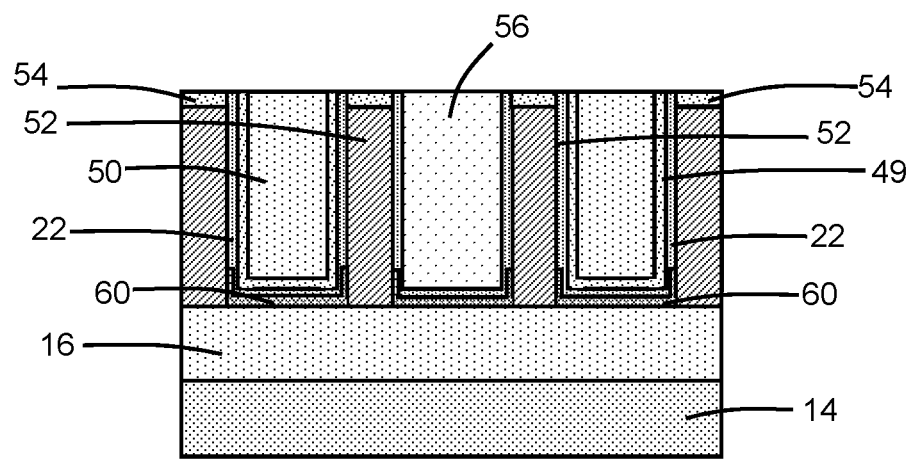
FIG. 11 is a cross-sectional view of a structure in accordance with alternative embodiments of the invention.

With reference to FIG. 11 in which like reference numerals refer to like features in FIG. 10B and in accordance with alternative embodiments, an etch stop layer 60 may be deposited and chamfered before the dielectric layer 22 is deposited. The etch stop layer 60 may be composed of a high-k dielectric material, such as hafnium oxide, aluminum nitride, or aluminum oxide, having a permittivity (i.e., dielectric constant) greater than the permittivity of silicon dioxide. The dielectric layer 22 is deposited after forming the etch stop layer 60.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. The chip may be integrated with other chips, discrete circuit elements, and/or other signal processing devices as part of either an intermediate product or an end product. The end product can be any product that includes integrated circuit chips, such as computer products having a central processor or smartphones.

References herein to terms modified by language of approximation, such as "about", "approximately", and "substantially", are not to be limited to the precise value specified. The language of approximation may correspond to the precision of an instrument used to measure the value and, unless otherwise dependent on the precision of the instrument, may indicate +/−10% of the stated value(s).

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction perpendicular to the horizontal, as just defined. The term "lateral" refers to a direction within the horizontal plane.

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected" or "indirectly coupled" to or with another feature if at least one intervening feature is present. A feature "on" or "contacting" another feature may be directly on or in direct contact with the other feature or, instead, one or more intervening features may be present. A feature may be "directly on" or in "direct contact" with another feature if intervening features are absent. A feature may be "indirectly on" or in "indirect contact" with another feature if at least one intervening feature is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:
   a semiconductor fin having an upper portion and a lower portion;
   a trench isolation region surrounding the lower portion of the semiconductor fin, the trench isolation region having a top surface arranged above the lower portion of the semiconductor fin and arranged below the upper portion of the semiconductor fin;
   a gate structure arranged to overlap with the upper portion of the semiconductor fin;
   a source/drain region including an epitaxial semiconductor layer physically connected with the upper portion of the semiconductor fin;
   a first dielectric layer arranged over the top surface of the trench isolation region, the first dielectric layer comprised of a low-k dielectric material; and
   a contact including a first portion arranged over the trench isolation region and a second portion coupled to the epitaxial semiconductor layer of the source/drain region,
   where the first dielectric layer is arranged between the top surface of the trench isolation region and the first portion of the contact, and the first portion of the contact has a directly contacting relationship with the first dielectric layer.

2. The structure of claim 1 wherein the first dielectric layer has a conformal thickness.

3. The structure of claim 1 wherein the first dielectric layer has a directly contacting relationship with the top surface of the trench isolation region.

4. The structure of claim 1 further comprising:
   an interlayer dielectric layer arranged over the trench isolation region,
   wherein the first dielectric layer is also arranged between the top surface of the trench isolation region and the interlayer dielectric layer.

5. The structure of claim 1 further comprising:
   a sidewall spacer adjacent to the semiconductor fin,
   wherein the sidewall spacer and the first dielectric layer intersect at the top surface of the trench isolation region.

6. The structure of claim 1 further comprising:
   a sidewall spacer adjacent to the semiconductor fin,
   wherein the sidewall spacer has a first thickness, and the first dielectric layer has a second thickness that is substantially equal to the first thickness.

7. The structure of claim 6 wherein the sidewall spacer and the first dielectric layer intersect at the top surface of the trench isolation region.

8. The structure of claim 1 further comprising:
   a sidewall spacer adjacent to the gate structure,
   wherein the sidewall spacer and the first dielectric layer intersect at the top surface of the trench isolation region.

9. The structure of claim 1 further comprising:
   a sidewall spacer adjacent to the gate structure,
   wherein the sidewall spacer has a first thickness, and the first dielectric layer has a second thickness that is substantially equal to the first thickness.

10. The structure of claim 9 wherein the sidewall spacer and the first dielectric layer intersect at the top surface of the trench isolation region.

11. The structure of claim 1 further comprising:
    a second dielectric layer arranged between the first dielectric layer and the top surface of the trench isolation region.

12. The structure of claim 1 wherein the contact contains a metal silicide.

13. The structure of claim 1 wherein the top surface of the trench isolation region is substantially planar.

14. The structure of claim 1 wherein the low-k dielectric material is SiOCN, SiBCN, SiCO, SiOC, or SiC.

15. The structure of claim 11 wherein the second dielectric layer is comprised of a high-k dielectric material.

16. The structure of claim 11 wherein the second dielectric layer has a conformal thickness.

17. The structure of claim 11 wherein the second dielectric layer is comprised of hafnium oxide, aluminum nitride, or aluminum oxide.

* * * * *